(12) United States Patent
Witty

(10) Patent No.: US 6,380,491 B1
(45) Date of Patent: Apr. 30, 2002

(54) METHOD FOR PRODUCING SNAP FIT APERTURES FOR RF SHIELD FENCES

(75) Inventor: Richard G. Witty, Kinnelon, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/383,701

(22) Filed: Aug. 26, 1999

(51) Int. Cl.$^7$ .............................. H05K 1/00; H05K 9/00
(52) U.S. Cl. ..................... 174/250; 174/260; 174/35 R; 174/256
(58) Field of Search ................. 174/250, 52.4, 174/35 R, 35 GC, 35 MS, 357 TS, 262, 260

(56) References Cited

U.S. PATENT DOCUMENTS

| | | | | |
|---|---|---|---|---|
| 5,414,222 A | * | 5/1995 | Sen et al. ................... | 174/262 |
| 5,499,446 A | * | 3/1996 | Murakami .................... | 29/852 |
| 5,559,676 A | * | 9/1996 | Gessaman .................... | 361/752 |
| 6,025,998 A | * | 2/2000 | Kitade et al. ............... | 361/800 |

* cited by examiner

Primary Examiner—Kamand Cuneo
(74) Attorney, Agent, or Firm—Gibbons Del Deo Dolan Griffinger & Vecchione

(57) ABSTRACT

A novel method is disclosed to create elongated apertures from circular holes provide a snap fit of square or rectangular tabs or tangs without requiring special tooling or milling. According to the method of the invention, at the intersection of the circular holes, points of engagement are formed that hold the square or rectangular tab in place. The size and spacing of the intersecting circular holes determine the depth of the points of engagement and the size of the square or rectangular tab that can be held.

19 Claims, 8 Drawing Sheets

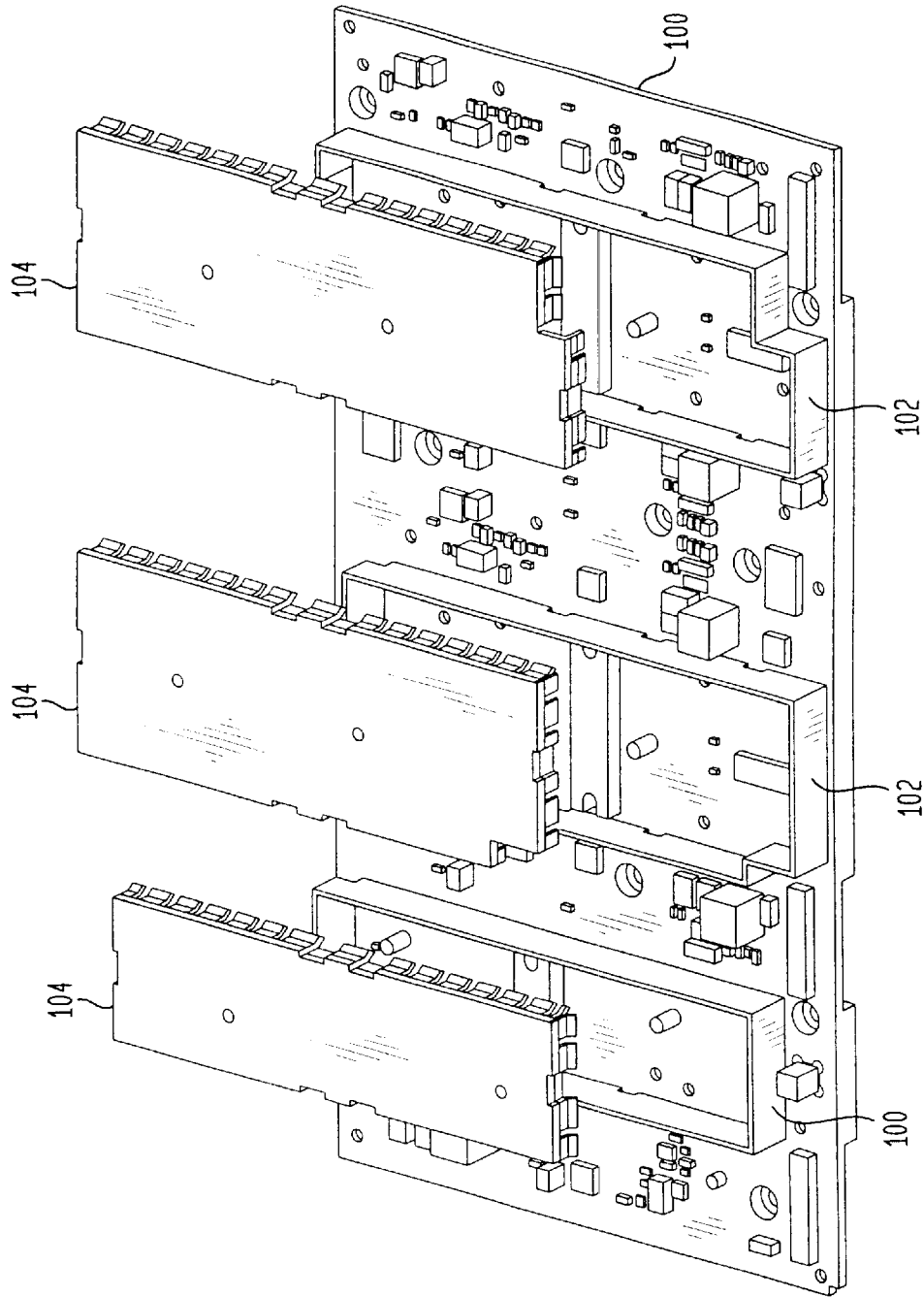

METHOD FOR PRODUCING SNAP FIT APERTURES FOR RF SHIELD FENCES

FIELD OF THE INVENTION

This invention is related to Radio Frequency (RF) shielding to reduce Electro-Magnetic Interference (EMI) caused by RF emissions. In particular the claimed invention simplifies the attachment of an RF shield fence to printed wiring boards.

BACKGROUND OF THE INVENTION

RF circuits are well known in the art to produce, amplify and modulate radio frequency energy. RF energy radiating from RF circuits is also known to increase the noise level that, in turn, interferes with the operation of adjacent electronic circuits. For example, the operation of adjacent electronic circuits may become erratic and unpredictable as RF emissions, and the resultant noise level, ebb and flow from the RF circuits. This RF interference, also known as electromagnetic interference (EMI), is an extremely important issue in determining the proper performance and functionality of electronic circuits adjacent to RF circuits. Accordingly, it is necessary to reduce the interference caused by radiating RF energy to protect sensitive electronic components and limit the level of radiation emanating from a product.

One method to protect sensitive components from RF interference is to place RF shields around critical electronic components. An RF shield is a continuous conductive structure that surrounds electronic components to prevent RF radiation from entering, leaving, or passing through the shield. Metallic RF shields, commonly referred to as "shield cans," separate RF circuits from one another, and provide isolation between signal paths, are well known in the art. RF shields are generally constructed in two parts; a thin continuous metallic wall that surrounds the circuitry and a cover that extends over the RF circuitry and attaches to the continuous metallic wall. The shield wall, commonly referred to as a fence, is typically soldered to a printed circuit board, or printed wiring board (PWB), and connected to the electrical ground of the board. The cover is held attached to the fence by numerous means that are well known in the art.

One well known method of attaching an RF shield to a PWB is by soldering the RF fence to the electrical ground of the PWB through tabs that reside on the bottom edge of the fence. Various means of attaching and holding metal tabs to PWBs are well known in the art; see U.S. Pat. No. 4,343,530 to Leger and U.S. Pat. No. 5,379,026 to Ohashi.

Tabs created on an RF shield fence are, typically, either rectangular or square in shape and require apertures in the PWB to be either slotted or circular in form. As the apertures created are generally larger than the tabs, the tabs fit loosely in the apertures and during the soldering process the thermal mismatch between the tabs and the PWB causes the tabs to lift out of the apertures. The lifting of the tab raises the RF fence off the surface of the PWB and creates a space, or gap, between the upper surface of the PWB and the fence. RF emissions are thus able to escape from, or enter into, the RF shield through this space, and the efficiency of the shield is diminished. Thus, there is a need to hold the RF shield fence in place during the solder process to prevent the fence from lifting off the surface of a PWB and the subsequent costly process of filling the gaps created through a hand soldering process.

SUMMARY OF THE INVENTION

The method of the invention forms elongated apertures that provide a snap fit attachment of square or rectangular tabs of RF shield fences to printed wiring boards. This snap fit attachment is produced by utilizing a unique methodology and does not require special tools or tooling. According to the method of the invention, a plurality of co-linear, intersecting, circular elements form an elongated aperture that securely holds a square or rectangular tab. At the intersection of the circular elements, prong-like protrusions extend into the created elongated aperture to decrease the internal dimension of the elongated aperture. The inserted tab is then held between these prongs as the fence is permanently attached to the PWB. The number and placement of a plurality of circular elements determines the lateral and internal dimensions of the resultant elongated aperture.

It is a advantage that the elongated apertures are formed, in accordance with the method of the invention, solely using circular openings, such as can be produced by a drill. By using a simple drilling operation, the cost of creating elongated apertures to hold square or rectangular tabs is reduced as neither special tooling nor milling is necessary.

BRIEF DESCRIPTION OF THE FIGURES

The advantages, nature and various additional features of the invention will appear more rally upon consideration of the illustrative embodiments to be described in detail in connection with the accompanying drawings. In the drawings:

FIG. 1 is a perspective view illustrating an exemplary embodiment of RF shield fences located on a PWB that enclose areas for the placement of electronic components;

FIG. 5b illustrates placement of an RF shield fence tab inserted into the elongated aperture illustrated in FIG. 5a;

It is to be understood that these drawings are for purposes of illustrating the concepts of the invention and are not to scale.

DETAILED DESCRIPTION OF INVENTION

The invention is specifically directed toward a method of forming elongated apertures in PWBs into which are inserted RF shield fence attachment tabs. According to the method of the invention, elongated apertures are created that provide a snap, or slight interference, fit attachment to a tab inserted into such apertures. Although the invention is particularly well suited for use in attaching RF shield fences to PWBs and shall be described with respect to this specific application, the invention may also be utilized whenever a snap, snug, or tight, fit of a square or rectangular tab, tang, or tap, is needed.

Referring to FIG. 1, RF shield fence 102 is fixedly attached to PWB 100 and encloses electronic components that radiate RF energy or require protection from RF emissions. RF shield cover 104, illustrated vertically displaced above RF shield fence 102 completes the enclosure of the electronic components, when RF shield cover 104 is placed in contact with RF shield fence 102.

Figure 2A:
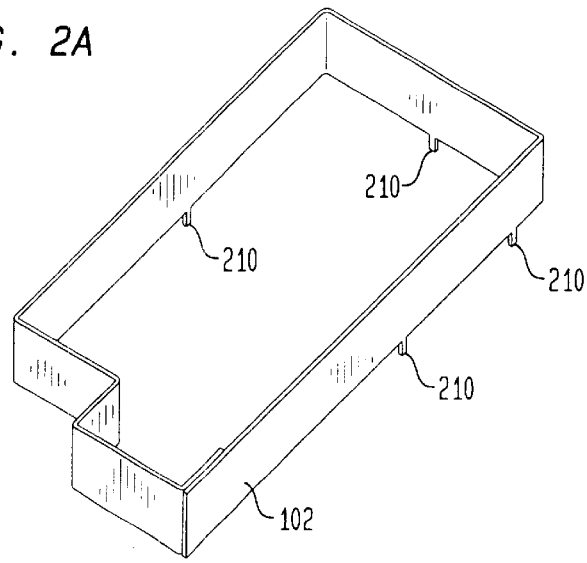
FIG. 2a is a perspective view illustrating an exemplary embodiment of an RF shield fence with tabs formed along the bottom edges.

FIG. 2 illustrates a typical RF shield fence 102 as a continuous metal wall with tabs 210 protruding from the bottom edge of the metal wall. Tabs 210, when inserted into slotted apertures 220 in PWB 100 set the location of RF shield fence 102 on PWB 100. Typically, permanent attachment of RF shield 102 is made by soldering the bottom of the fence to an electrical ground on PWB 100.

Figure 2B:
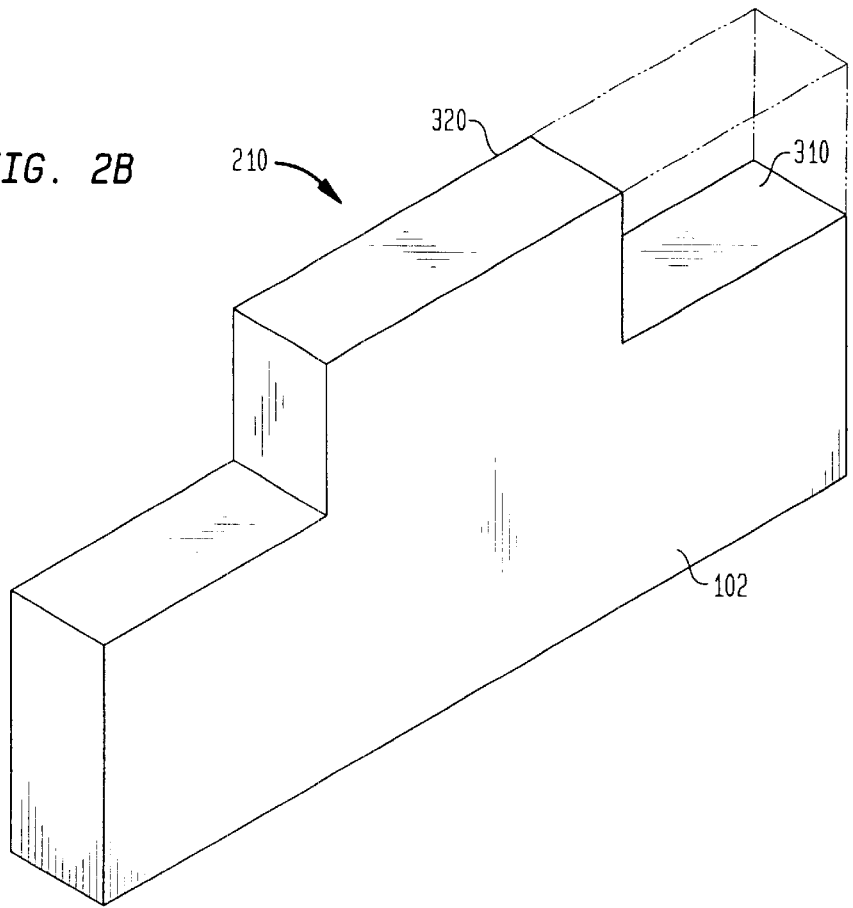
FIG. 2b is an exploded perspective view illustrating a bottom view of an exemplary embodiment of an RF shield fence wall and rectangular tab created along the bottom edge of an RF fence wall.

FIG. 2b illustrates a rectangular tab 210 formed along a bottom edge 310 of RF shield fence 102. In this example, tab 210 is formed from the original bottom edge 320 of continuous fence wall 102 by keeping in place (or not removing) material from the fence wall. That is, tab 210 is formed from the original metal wall by leaving in place metal in those areas where tab 210 is required. Typically, the bottom edge material is removed from the original wall such that the depth of tab 210 is slightly larger than the width of PWB 100 and the length of tab 210 is alterable, depending on the amount of material keep in place from the original bottom edge of the fence wall. The width of tab 210 is typically the same as the width of the fence wall 102.

Figure 3:
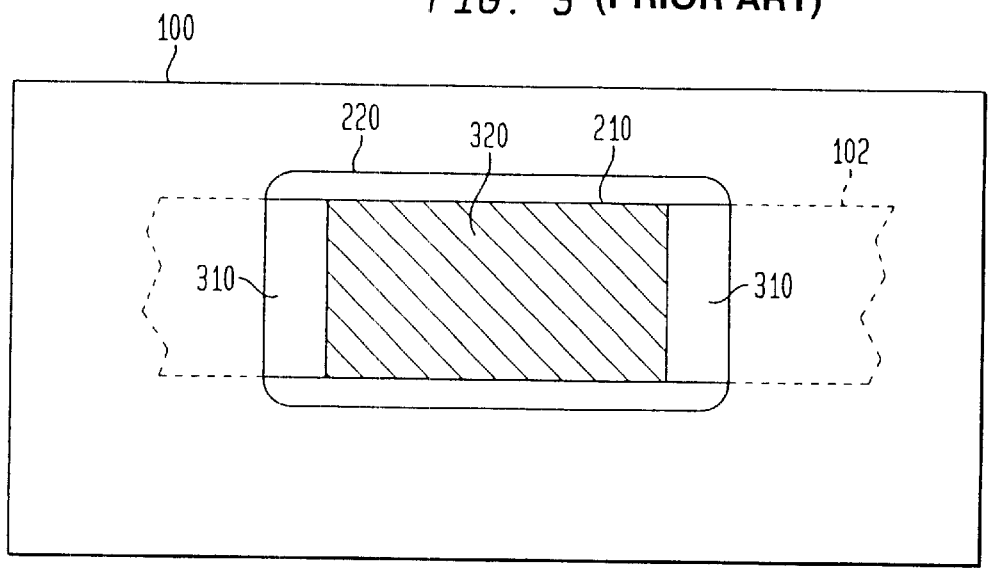
FIG. 3 illustrates placement of an RF shield fence tab into a typical slotted aperture.

FIG. 3 illustrates RF fence tab 210 inserted into a typical slotted aperture 220 formed in PWB 100. In this illustration RF fence 102 resides on the top surface of PWB 100 and fence tab 210 extends through slotted aperture 220. Slotted aperture 220, typically, is formed larger than tab 210 to allow for variations, in both size and position of tab 210, and to insure the bottom of fence 102 rests on PWB 100 in electrical contact with a good electrical ground. For example, in one embodiment, fence tab 210 measuring 0.040 inches in length and 0.024 inches in width would fit into slotted aperture 220 measuring 0.056×0.028 inches. In this example, the area of slotted aperture 220 is approximately 63 percent larger than the area of tab 210.

Creation of slotted aperture 220, however, is a costly process, in both time and labor as special tooling is necessary to mill the substantially rectangular shape of slotted aperture 220 from the material of PWB 100.

Figure 4:
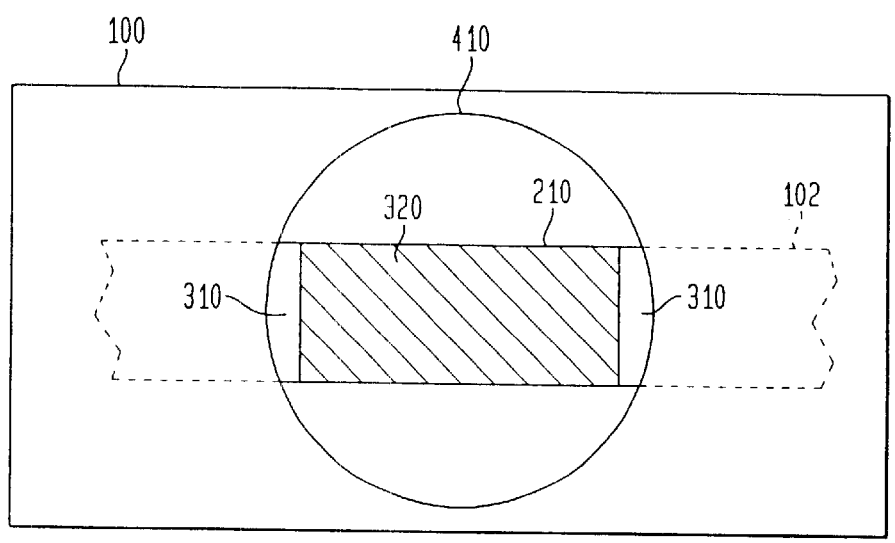
FIG. 4 illustrates placement of an RF shield fence tab into a typical circular aperture.

A less costly method of creating an opening to accommodate tab 210 is simply to drill a circular hole large enough to fit tab 210. FIG. 4 illustrates RF fence tab 210 inserted into circular opening 410 that is large enough to receive tab 210. Similar to the view illustrated in FIG. 3, FIG. 4 depicts the undersurface of PWB 100 with RF fence 102 located on the upper surface of PWB 100 and tab 210 protruding through circular opening 410. In this exemplary illustration, circular-opening 410 created for a rectangular tab is substantially larger than the tab. Using the exemplary dimensions of tab 210 of the previous example (0.040×0.024 inches), circular opening 410 is required to have a diameter of 0.056 inches to accommodate rectangular tab 210. Accordingly, the area of circular opening 410, in this exemplary example, is approximately 156 percent larger than the area of tab 210.

The larger size of slotted aperture 220 and circular aperture 410, as discussed previously enables tab 210 to move and shift during the process of attaching fence 102 to PWB 100. As solder flows into the larger slotted aperture 220 or circular opening 410, and over tab 210, the high temperature of the solder process produces a thermal mismatch between PWB 100 and tab 210 that causes tab 210 to shift and rise from the aperture. The rising of tab 210 causes RF fence 102 to lift from the upper surface of PWB 100 and a space, or gap, is formed between RF fence 102 and PWB 100. RF emissions may enter into, or escape from, this space or gap. This gap created as a result of present methodologies causes a reduction in the effectiveness of the RF shield enclosure. The correction of this problem is expensive and time-consuming, as the created gap must be filled by hand soldering.

Figure 5A:
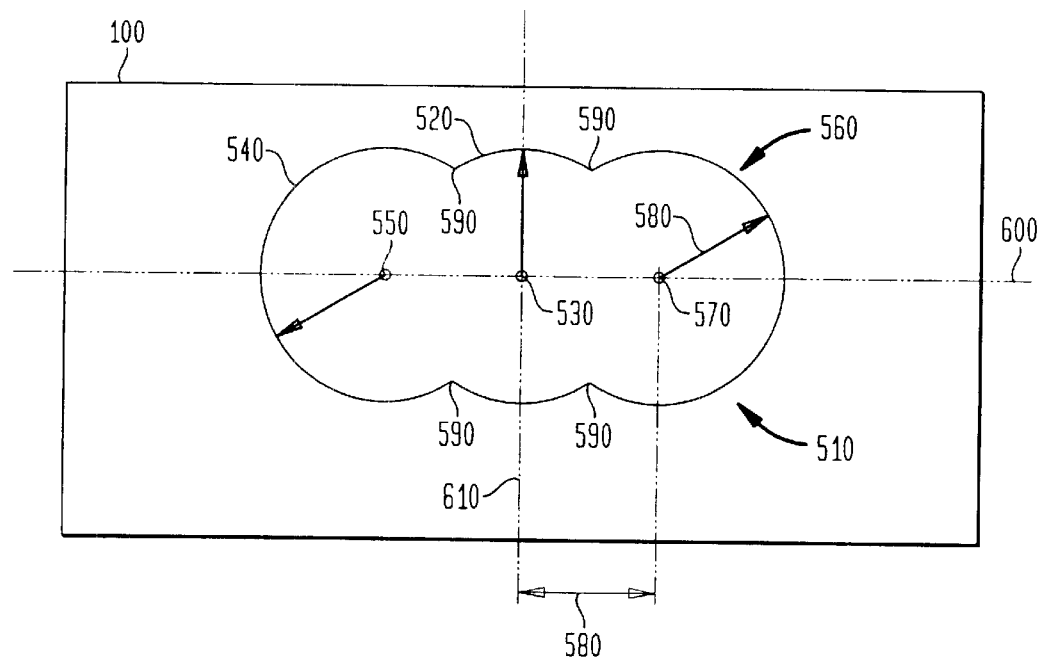
FIG. 5a illustrates an elongated aperture created in accordance with the method of the invention employing an exemplary dimensional spacing of circular elements.

FIG. 5a illustrates one embodiment of an elongated aperture, created in accordance with the method of the invention, that provides a snap fit attachment of rectangular tabs. In this exemplary embodiment, elongated aperture 510 is formed by the intersection of three circular elements, 520, 540, and 560, The three circular elements are distributed along a lateral axis and are positioned to overlap an adjacent circular element by a known amount.

More particularly, circular element 520 is characterized by center 530 and radius 580 and is positioned on lateral centerline 600 symmetrically with respect to a vertical centerline of aperture 510. Circular element 540, characterized by center 550 and radius 580, and circular element 560, characterized by center 570 and radius 580, are positioned adjacently and in a lateral relation to circular element 520. Centers 550 and 570 are positioned along lateral centerline 600 and, in this exemplary embodiment, are symmetrically separated from center 530 by radius 580. In this exemplary embodiment, elongated aperture 510 has a lateral dimension four times larger than radius 580 and an internal dimension (width) twice as large as radius 580.

As an example of the method of the invention, by choosing radius 580 to be 0.014 inches, elongated aperture 510 is formed having lateral and internal measurements of 0.056 inches by 0.028 inches. Elongated aperture 510 formed, in this exemplary example, is comparable to the exemplary dimensions of slotted aperture 220, but no special tooling or milling is necessary.

Further illustrated, in FIG. 5a, are projections 590 formed at the intersection of circular elements 520 540, and 560. These projections reduce the width of elongated aperture 510 and provide points that may contact an inserted tab. By selecting the relation between intersecting circular elements according to the method of the invention, the distance between these points of contacts or engagement may be adjusted to accommodate any size tab.

Figure 5B:
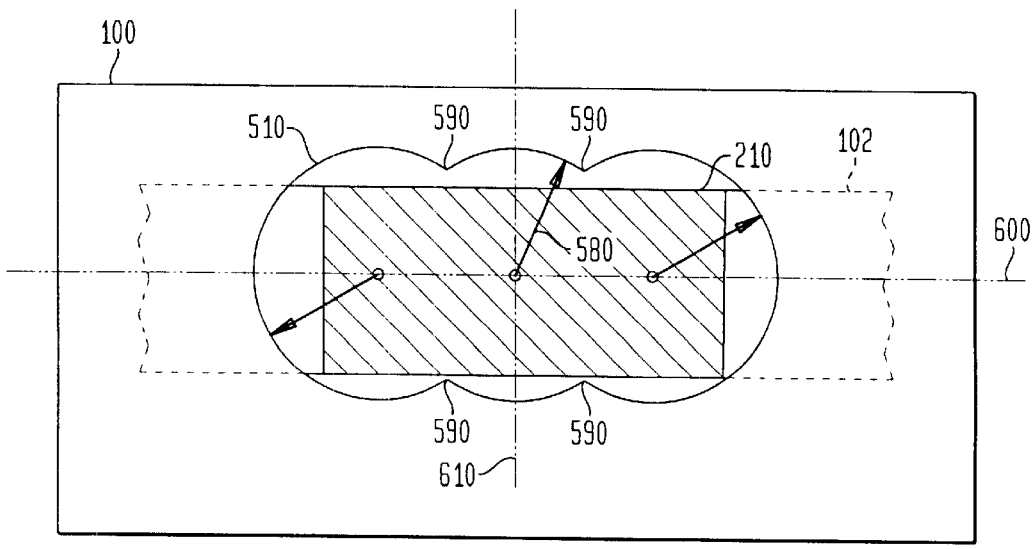

FIG. 5b illustrates the insertion of tab 210 into elongated aperture 510 of FIG. 5a and the close fit of projections 580 to tab 210. Using the exemplary radius 580 of 0.014 inches, the dimension (width) between opposing projections 590 can be shown to measure 0.0245 inches. These dimensions are just slightly larger than the exemplary dimensions of tab 210 (i.e., 0.0240 inches) and thus provide for a snug fit against tab 210. This snug fit hold tab 210 in place and prevents the RF fence from shifting during the soldering process.

Figure 6:
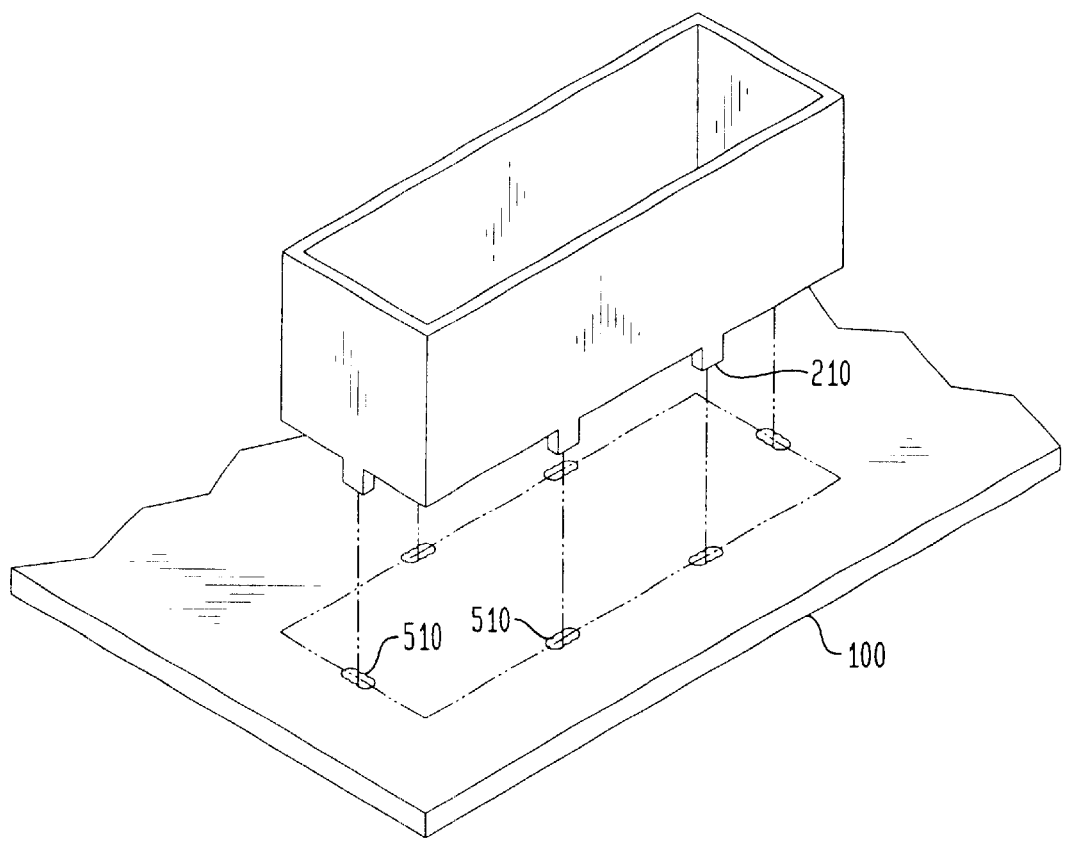
FIG. 6 is a perspective view illustrating an exemplary embodiment of an RF shield fence with tabs positioned above a PWB containing elongated apertures created in accordance with the method of the invention.

FIG. 6 illustrates a typical embodiment of a plurality of elongated apertures formed in PWB 100, in accordance with the method of the invention, into which an RF shield fence tabs 210 may be inserted with a snap interference, or snug, fit. Various arrangements of aperture alignment and sizing may be formed to accommodate specific tab configurations and fence thickness.

Figure 7:
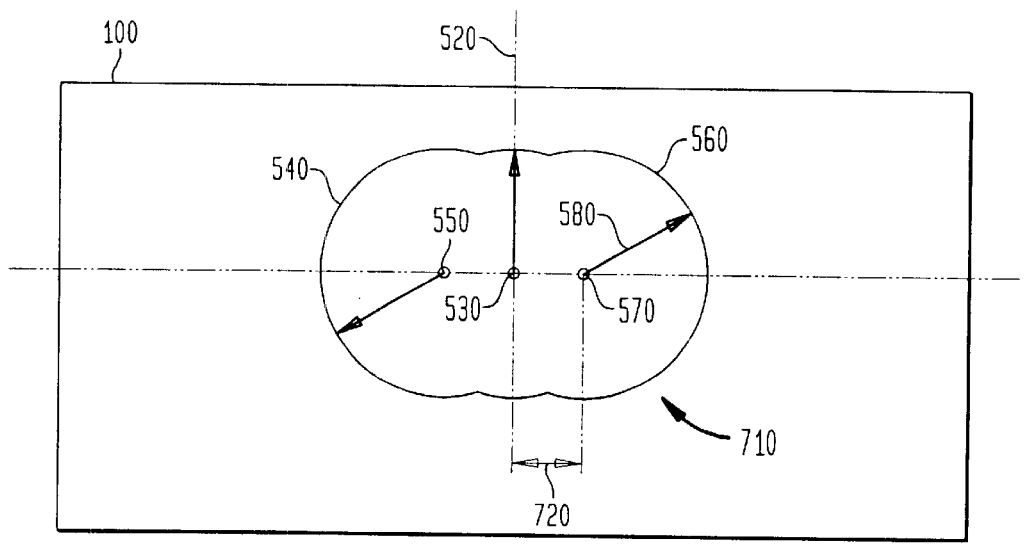
FIG. 7 illustrates an elongated aperture created in accordance with the method of the invention using a second exemplary separation of circular elements.

FIG. 7 illustrates another embodiment of an elongated aperture 710 created according to the method of the invention sized to accommodate thicker RF shield fence tabs can discussed in the exemplary example herein. In this embodiment, circular element 520, characterized by center 530 and radius, R, 580, circular element 540, characterized by center 550 and radius 580, and circular element 560, characterized by center 570 and radius 580, are positioned along lateral axis 600. The lateral separation 720 between centers, 530 and 550, in this embodiment is 50 percent that of radius, R, 580. As illustrated, the distance between opposing projections 590 is only slightly reduced in width compared to radius 580 and thus, tab 210 may be made from a thicker material.

Figure 8:
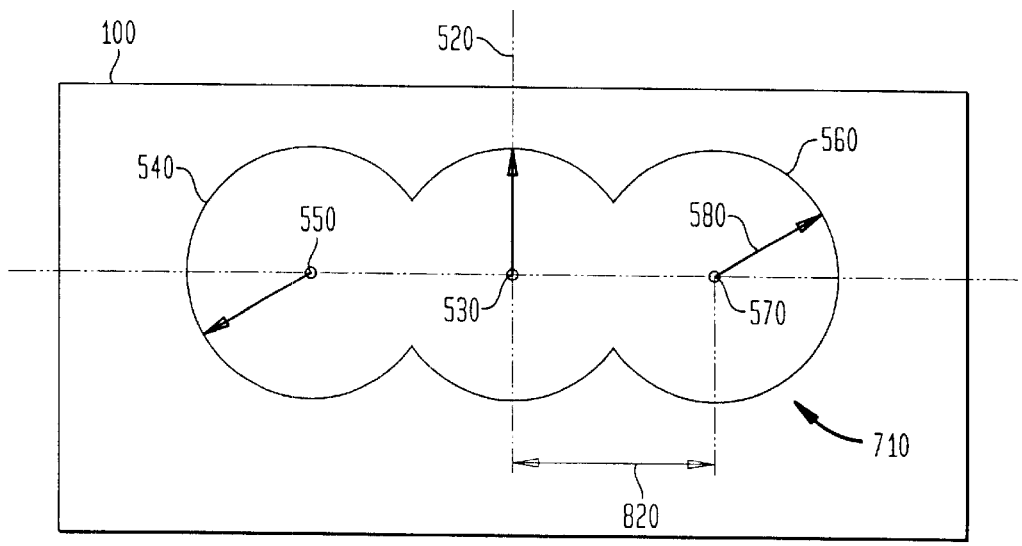
FIG. 8 illustrates an elongated aperture created in accordance with the method of the invention using still another exemplary separation of circular elements.

FIG. 8 illustrates another embodiment of an elongated aperture 810 created according to the method of the invention. In this embodiment, the lateral separation between centers is increased to be 150 percent of radius 580 (1.5 R). In this embodiment, circular elements 520, 540 and 560, are characterized by centers 530, 550, and 570, respectively, and radius 580. As illustrated, the distance between opposing projections 590 is significantly reduced compared to radius 580. In this embodiment, tab 210 may be made from a thinner material.

As shown in FIGS. 7 and 8, elongated apertures of varying size can be created according to the method of the invention to accommodate different degrees of thickness for inserted tab 210. Table 1 shows exemplary dimensions of elongated apertures that may be created using three circular elements of substantially the same radius, R. It should be understood that Table 1 presents exemplary values of three circular elements with exemplary lateral separation of centers 530, 550 and 570, and that a continuum of such values may be realized along with corresponding dimensions of elongated aperture sizes. Further, Table 1 is not intended to limit the method of the invention solely to three circular elements. The number of circular openings used to create elongated apertures may be increased or decreased with a corresponding increase or decrease in the lateral dimension.

TABLE 1

Elongated Aperture Dimensional Values as Function of Radius (R) using 3 Circular Elements.

| Center Separation | Lateral Dimension | Width, y |
| --- | --- | --- |
| 0.5 R | 3 R | 1.92 R |
| 1.0 R | 4 R | 1.75 R |
| 1.5 R | 5 R | 1.33 R |

Table 2 illustrates the dimensions of elongated apertures when four circular elements of substantially the same radius, R are used to create elongated apertures.

TABLE 2

Elongated Aperture Dimensional Values as Function of Radius (R) using 4 Circular Elements.

| Center Separation | Lateral Dimension | Width, y |
| --- | --- | --- |
| 0.5 R | 4.5 R | 1.92 R |
| 1.0 R | 5.0 R | 1.75 R |
| 1.5 R | 5.5 R | 1.33 R |

Figure 8A:
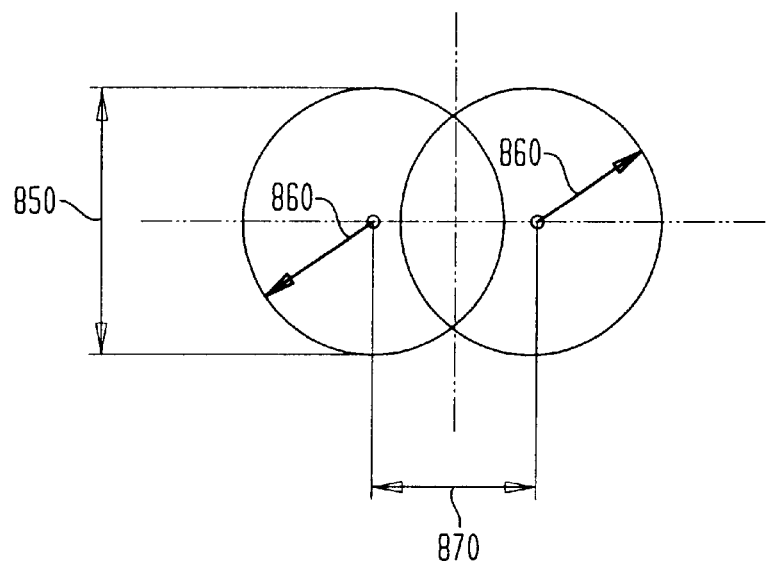
FIG. 8a illustrates the intersection of two circular elements of equal radius.

From Table 1 and Table 2, it is evident that the width between opposing projections of the created aperture is related to the separation between the centers of the circular elements. This width dimension, as illustrated in FIG. 8a, may be determined as:

$$y=R(4-k^2)^{1/2} \qquad \text{[Equation 1]}$$

where y is the dimension between opposing projections;
R is the radius of the circular elements;
k is a constant factor between 0 and 2;
"kR" is the distance between centers of intersecting adjacent circular elements; and $$R^2 = \left(\frac{kR}{2}\right)^2 + \left(\frac{y}{2}\right)^2.$$

Figure 9:
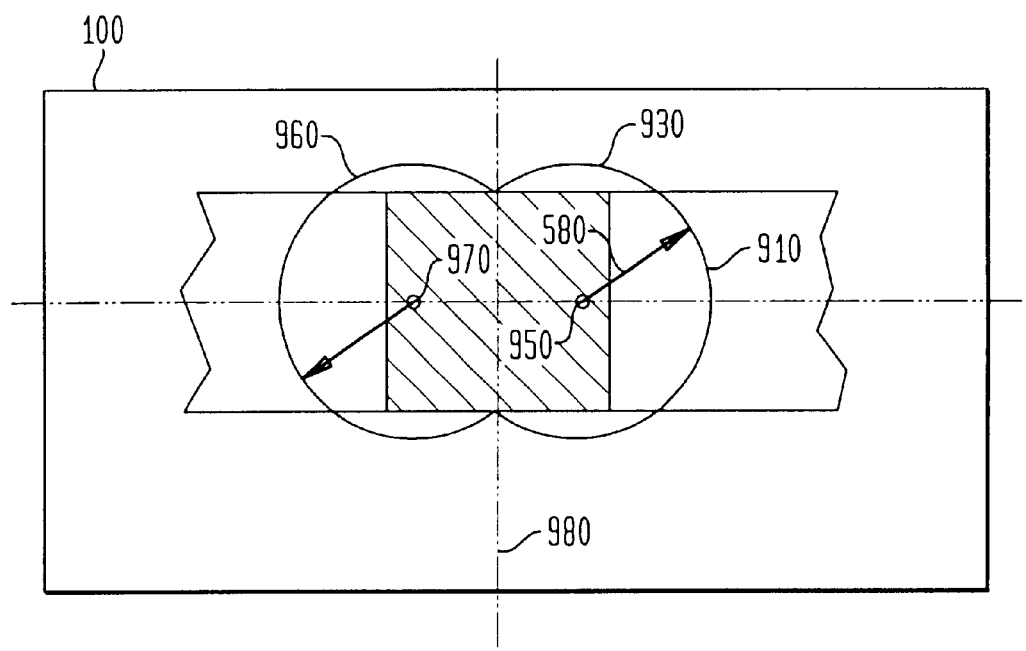
FIG. 9 illustrates placement of a square RF shield fence tab in an embodiment of an elongated aperture created using two circular elements in accordance with the method of the invention.

FIG. 9 illustrates another exemplary embodiment of elongated aperture 910 created in accordance with the method of the invention using two circular elements. In this embodiment square tab 920 having side 990 is retained with a snap fit. In accordance with the method of the invention, circular elements 930 and 960, characterized by center 950 and 970, respectively, and each with radius 580, are positioned along lateral centerline 940. In this embodiment, centers 950 and 970 are offset, symmetrically, from vertical centerline 980 by one half radius 580 (0.5 R). Accordingly, the lateral separation between centers 950 and 970 is radius 580, and the width between the opposing projections 590 is, from Table 1, 175 percent of radius 580 (1.75 R)

Using the exemplary value of radius 580 from the previous example, (0.014 inches), elongated aperture 910 can be shown to have dimensions of 0.042 by 0.028 inches and a width between opposing projections of 0.0245 inches. Thus, elongate aperture 910 is capable of snugly and securely fitting square tab 920 of dimension 0.024×0.024 inches.

The creation of elongated apertures for square tabs, according to the method of the invention is advantageous over a similar aperture created by a single circular opening as was illustrated in FIG. 4. A single circular opening typically is wider than elongated apertures created by the disclosed method because the circular opening must accommodate the larger diagonal dimension of the square side. As an example, a circular opening to accommodate square tab 920 (i.e., 0.024×0.024 inches) of radius, must be at least, 0.018 inches. An opening of this size has an overall width of 0.036 inches compared to an overall width of 0.028 inches of the aperture created in accordance with the method of the invention.

Figure 10:
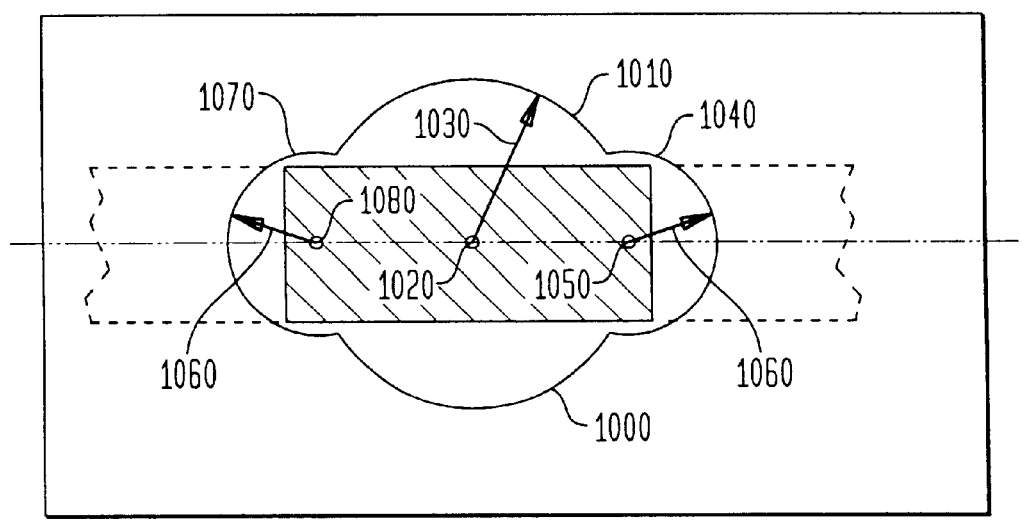
FIG. 10 illustrates placement of a rectangular RF shield fence tab in an elongated aperture created in accordance with the method of the invention using circular elements of different radii.

FIG. 10 illustrates another elongated aperture created in accordance with the method of the invention in which circular opening 1000 is formed from the intersection of three circular elements of unequal radius—i.e., circular element 1010, characterized by center 1020 and radius 1030, circular element 1040, characterized by center 1050 and radius 1060 and circular element 1070, characterized by center 1080 and radius 1060. In this exemplary embodiment, radius 1060 is 50 percent of radius 1030 and the distance between centers 1020 and 1050, and between centers 1020 and 1080 is substantially equal to radius 1030. As illustrated, the dimension between opposing projections of aperture 1000 is significantly reduced at the intersection of the circular elements. The aperture 1000 created, in this embodiment, measures 0.042×0.013 inches when radius 1030 is taken as the exemplary dimension of radius 580 (i.e., 0.014 inches). Thus, an aperture may be created to accommodate substantially thinner tabs without special tooling.

Figure 11:
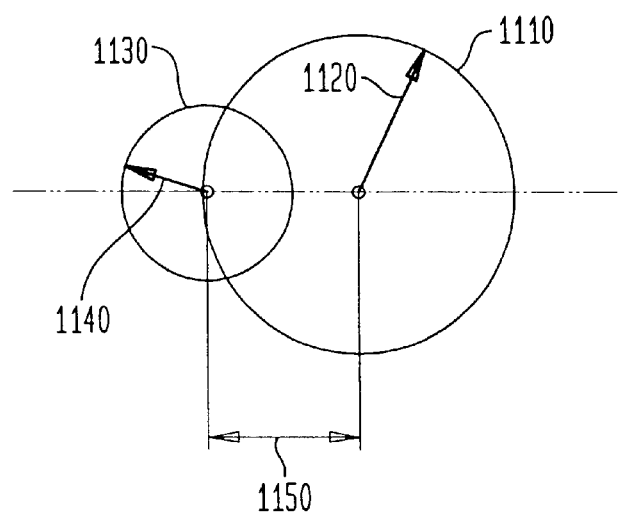
FIG. 11 illustrates the aperture formed by two circular elements of unequal radius.

In this embodiment of the method using circular elements with unequal radii, as illustrated in FIG. 11, the distance between opposing projections may be determined as:

$$y=R(4p^2-((p^2-k^2-1)^2)/k^2))^{1/2} \qquad \text{[Equation 2]}$$

where y is the longitudinal dimension between opposing projections;

R is the radius of the largest circular element;

"pR" is the radius of the smaller circular element p is a percentage of radius R, between 0 and 1;

k is a constant factor between 0 and (1+p);

"kR" is the distance between centers of intersecting adjacent circular elements; and $$R^2 = \left(\frac{y}{2}\right)^2 + (kR-a)^2; \text{ and}$$

$$(pR)^2 = \left(\frac{y}{2}\right)^2 + (a)^2$$

The present invention promotes a novel method for fitting a square or rectangular tab in an elongated aperture. The method creates prongs that extend into an elongated aperture that engage an inserted tab to securely hold and limit the movement of the tab. According to the method of the invention, and as illustrated in the exemplary examples contained herein, elongated apertures of varying dimensions can be created to accommodate and provide a snug fit for a plurality of different square and rectangular tab sizes.

Numerous modifications and alternative embodiments of the claimed invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather that limitation, and that details of the structure may be varied substantially without departing from the spirit of the invention and the exclusive use of all modifications which come within the scope of the appended claims is reserved.

What is claimed is:

1. A board having at least one elongated aperture into which fits a male tab having a length and width, the at least one elongated aperture is comprised of:

a plurality of circular elements, each of said plurality of circular elements being characterized as having a radius and a center wherein the smallest of said plurality of radii is greater than one-half of said male tab width; and each of said centers are positioned along a co-linear axis wherein said plurality of circular openings overlap one another and the span of said plurality of circular openings is larger than said length of said male tab and the width of said aperture, perpendicular to said co-linear axis, is larger than said width of said male tab.

2. The elongated aperture according to claim 1 further comprised of positioning said plurality of circular element centers symmetrically with respect to an axis perpendicular to said co-linear axis.

3. The elongated aperture according to claim 1 wherein each of said plurality of circular elements overlap at least one other of said plurality of circular elements.

4. The elongated aperture according to claim 1 wherein said plurality of circular elements have unequal radii and each of the centers of said plurality of circular elements are positioned along said co-linear axis as a function of the largest of said plurality of radii.

5. The elongated aperture according to claim 1 wherein, said plurality of circular openings have substantially the same radii, R.

6. The elongated aperture according to claim 5 wherein each of said plurality of centers are separated from an adjacent center by an equal distance.

7. The elongated aperture according to claim 1 wherein said width of said aperture has a value y, wherein:

$$y=R(4-k^2)^{1/2}$$

8. The elongated aperture according to claim 7 wherein each of said plurality of centers is separated from an adjacent center by an equal distance.

9. The elongated aperture according to claim 1 wherein said width of said aperture has a value y, wherein:

$$y=R(4p^2-((p^2-k^2-1)^2)/k^2))^{1/2}.$$

10. A method of forming elongated apertures on a surface to fit male tabs having a length and width, the method comprising the steps of:

a. selecting N circular elements, each of said N selected elements being characterized as having a radius and a center wherein the smallest of said N selected element radii is greater than one-half of said male tab width;

b. positioning said centers of each of said N circular element along a co-linear axis wherein said N circular openings overlap one another and the span of said N selected circular elements is larger than said length of said male tab and the width of said aperture, perpendicular to said co-linear axis, is larger than said width of said male tab.

11. The method according to claim 10 further includes positioning said N centers symmetrically with respect to an axis perpendicular to said co-linear axis.

12. The method according to claim 10 wherein positioning of each of said N selected circular elements to overlap at least one other selected circular element.

13. The method according to claim 1 wherein said N circular elements have unequal radii wherein said centers of said N selected circular elements are positioned along said co-linear axis as a function of the largest of said radii.

14. The method according to claim 10 wherein, said selected N circular elements have substantially the same radii, R.

15. The method according to claim 14 wherein each of said selected centers is separated from an adjacent center of said N selected elements by an equal distance.

16. The method according to claim 10 wherein said with of said aperture, perpendicular to said co-linear axis, has a value y, wherein:

$$y=R(4-k^2)^{1/2}.$$

17. The method according to claim 10 wherein, said selected N circular element have unequal radii wherein said smaller radii are a function, p, of the largest of said radii, R, and p is between 0 and 1.

18. The method according to claim 17 wherein each of said centers is separated from an adjacent center of said N selected element by an equal distance.

19. The method according to claim 10 wherein said width of said aperture, perpendicular to said co-linear axis, has a value y, wherein:

$$y=R(4p^2-((p^2-k^2-1)^2)/k^2))^{1/2}.$$

* * * * *